United States Patent
Ho et al.

(10) Patent No.: US 8,290,729 B2
(45) Date of Patent: Oct. 16, 2012

(54) LOW VOLTAGE DIFFERENTIAL SIGNALING TIMING TEST SYSTEM AND METHOD

(75) Inventors: Jui-Hsiung Ho, Taipei Hsien (TW); Wang-Ding Su, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 226 days.

(21) Appl. No.: 12/817,149

(22) Filed: Jun. 16, 2010

(65) Prior Publication Data

US 2011/0130990 A1    Jun. 2, 2011

(30) Foreign Application Priority Data

Nov. 27, 2009   (CN) .......................... 2009 1 0310585

(51) Int. Cl.
*G01R 29/027* (2006.01)
(52) U.S. Cl. .................. 702/69; 702/67; 702/79
(58) Field of Classification Search .................... 702/57, 702/67, 69, 70, 79, 80, 117, 149
See application file for complete search history.

(56) References Cited

U.S. PATENT DOCUMENTS

2003/0165259 A1* 9/2003 Balent et al. .................. 382/113
2005/0071108 A1* 3/2005 Kulidjian et al. ............. 702/117

OTHER PUBLICATIONS

Chang, J. How to Validate BLVDS SER/DES Signal integrity Using an Eye Mask. National Semiconductor Application Note 1217 [online], Mar. 2002 [retrieved Mar. 22, 2012]. Retrieved from the Internet: <URL:http://www.ti.com/lit/an/snla053/snla053.pdf>.*

* cited by examiner

*Primary Examiner* — Mohamed Charioui
*Assistant Examiner* — Paul D Lee
(74) *Attorney, Agent, or Firm* — Altis Law Group, Inc.

(57) ABSTRACT

In a low voltage differential signal (LVDS) timing test system and method, a clock signal waveform and a data signal waveform are obtained. Clock cycles are selected from the clock signal waveform. Data bits transmitted within the selected clock cycles are identified from the data signal waveform. Accordingly, bit positions of the data bits are determined.

12 Claims, 6 Drawing Sheets

| Clock cycle = T | | | | |
|---|---|---|---|---|
| Bit position | Minimum reference value | Typical value | Maximum reference value | Unit |
| Pos0 | -0.2 | 0 | 0.2 | ns |
| Pos1 | T/7-0.2 | T/7 | T/7+0.2 | ns |
| Pos2 | 2T/7-0.2 | 2T/7 | 2T/7+0.2 | ns |
| Pos3 | 3T/7-0.2 | 3T/7 | 3T/7+0.2 | ns |
| Pos4 | 4T/7-0.2 | 4T/7 | 4T/7+0.2 | ns |
| Pos5 | 5T/7-0.2 | 5T/7 | 5T/7+0.2 | ns |
| Pos6 | 6T/7-0.2 | 6T/7 | 6T/7+0.2 | ns |

FIG. 6

LOW VOLTAGE DIFFERENTIAL SIGNALING TIMING TEST SYSTEM AND METHOD

BACKGROUND

1. Technical Field

Embodiments of the present disclosure relate to signal test systems and methods, and particularly to a low voltage differential signaling (LVDS) timing test system and method.

2. Description of Related Art

LVDS is an electrical signaling system that can transmit differential signals at high data transfer rates with a low power consumption. Timing relationship between clock signals and data signals of LVDS is required to be tested to ensure error free data transmission. Currently, LVDS timing tests are manually performed, which is inefficient and error prone.

BRIEF DESCRIPTION OF THE DRAWINGS

FIG. 6 illustrates one embodiment of LVDS timing specifications.

DETAILED DESCRIPTION

In general, the word "module," as used herein, refers to logic embodied in hardware or firmware, or to a collection of software instructions, written in a program language. In one embodiment, the program language may be Java or C. One or more software instructions in the modules may be embedded in firmware, such as an EPROM. The modules described herein may be implemented as either software and/or hardware modules and may be stored in any type of computer-readable medium or other storage device.

Figure 1:
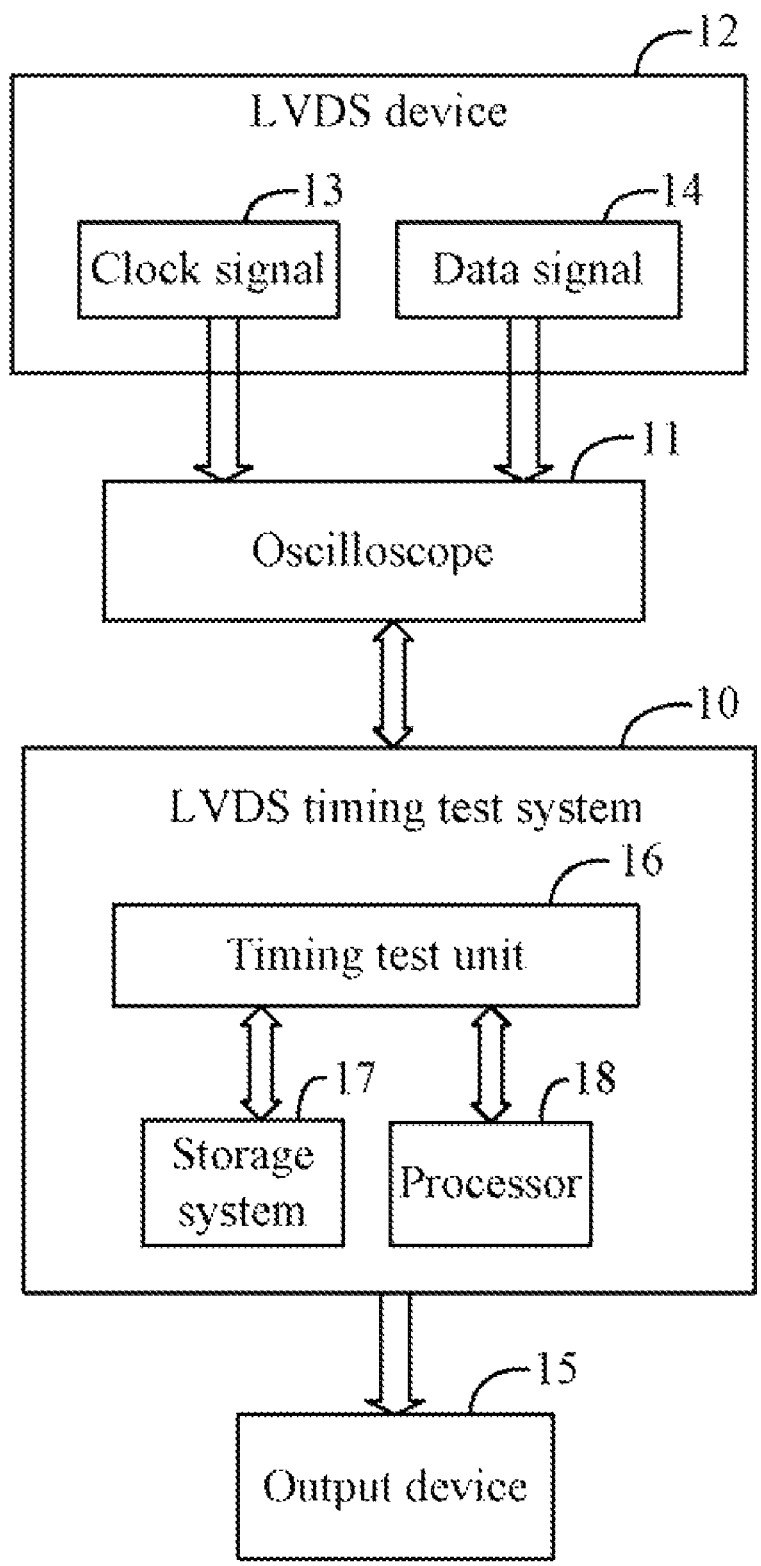
FIG. 1 is one embodiment of an application environment of a low voltage differential signaling (LVDS) timing test system.

FIG. 1 is a block diagram of one embodiment of an application environment of a low voltage differential signaling (LVDS) timing test system 10. In one embodiment, the test system 10 is connected to an oscilloscope 11 and an LVDS device 12 in series. The test system 10 may be a data processing device or a computerized device such as a personal computer, an application server, or a workstation, for example. The LVDS device 12 may be an electronic device that generates a clock signal 13 and one or more data signals 14. The clock signal 13 synchronizes data transmission of the data signal 14. Both the clock signal 13 and the data signal 14 may be differential signals. The test system 10 tests a timing relationship between the clock signal 13 and the data signal 14 to determine whether data transmission of the LVDS device 12 is correct. The oscilloscope 11 may be a digital storage oscilloscope (DSO) that can capture signal waveforms of the clock signal 13 and the data signal 14. The test system 10 may be further connected to an output device 15 such as a display screen or a printer, which outputs test results to users.

In one embodiment, the test system 10 may include a timing test unit 16, a storage system 17, and a processor 18. One or more computerized codes of the timing test unit 16 may be stored in the storage system 17 and executed by the processor 18. In one embodiment, the storage system 17 may include a memory, a cache, and a hard disk drive.

Figure 2:
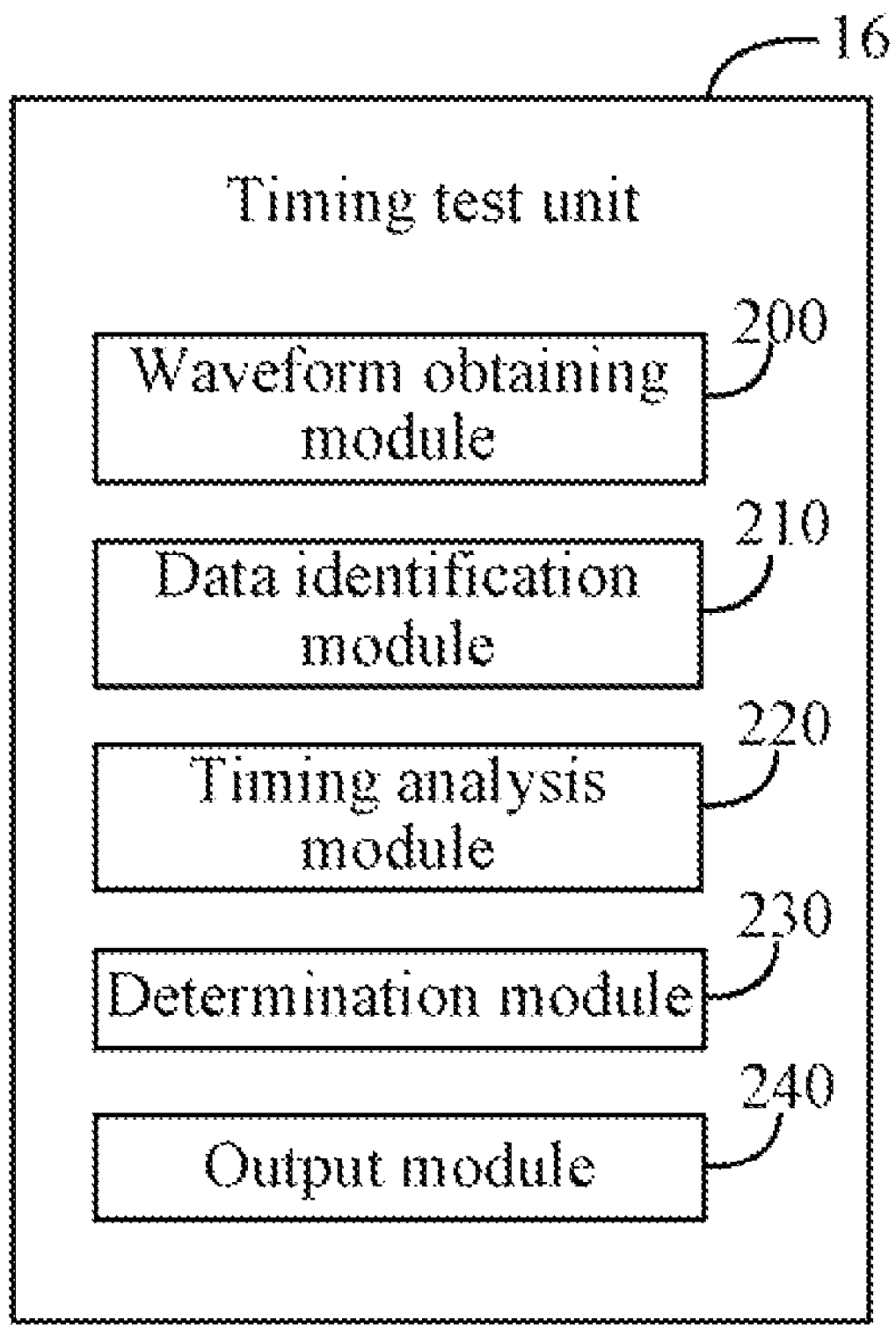
FIG. 2 is a block diagram of one embodiment of a timing test unit in FIG. 1.

FIG. 2 is a block diagram of one embodiment of the timing test unit 16 in FIG. 1. In one embodiment, the timing test unit 16 may include a waveform obtaining module 200, a data identification module 210, a timing analysis module 220, a determination module 230, and an output module 240.

Figure 4:
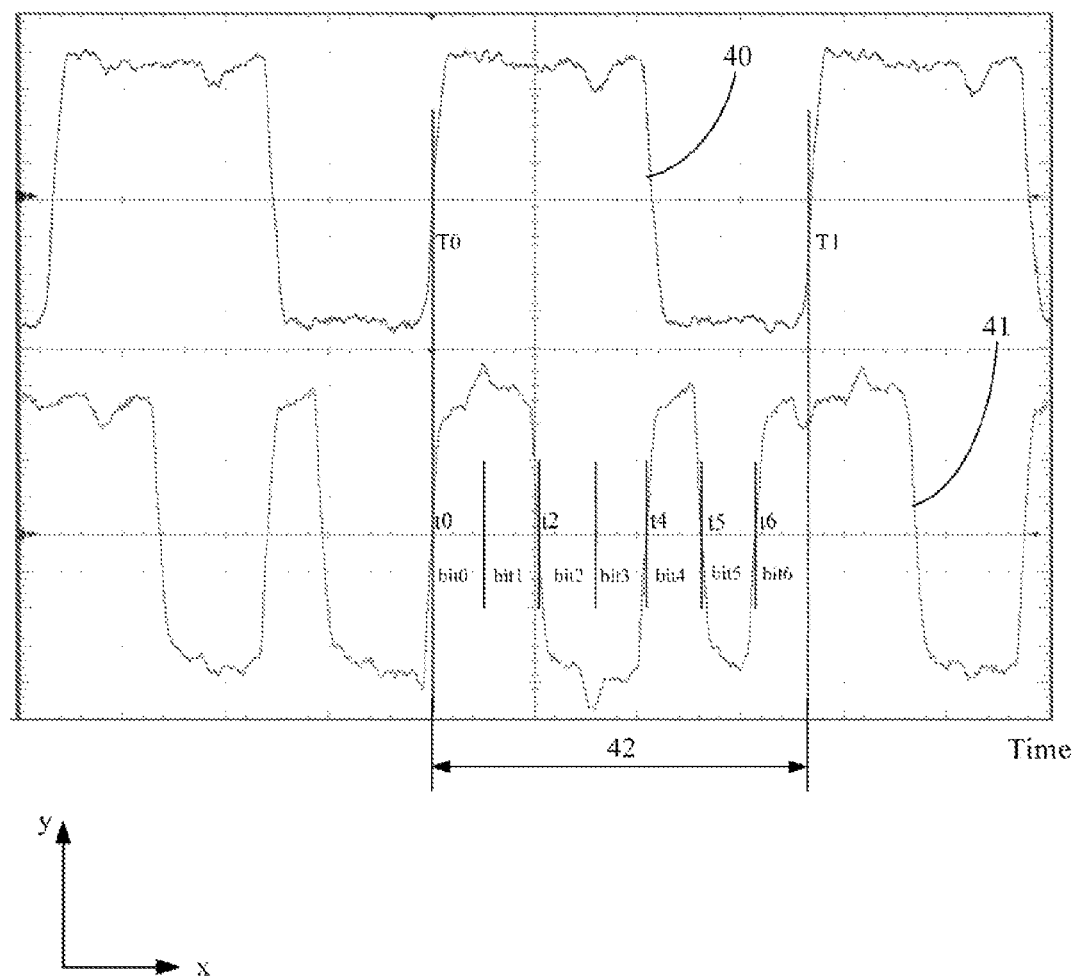
FIG. 4 illustrates one embodiment of a clock signal waveform and a data signal waveform.

The waveform obtaining module 200 obtains a waveform of the clock signal 13 (hereinafter, "clock signal waveform") and a waveform of the data signal 14 (hereinafter, "data signal waveform"). It may be understood that a signal waveform is a graph of voltage plotted against time. In one embodiment, the waveform obtaining module 200 may control the oscilloscope 11 to obtain the data signal waveform and the clock signal waveform. FIG. 4 illustrates one embodiment of a clock signal waveform 40 and a signal waveform 41, where voltage is represented by the y-axis and time is represented by the x-axis of the waveforms 40, 41.

The data identification module 210 selects clock cycles of the clock signal 13 from the clock signal waveform, and identifies data bits transmitted within the selected clock cycles from the data signal waveform. In one embodiment, the data identification module 210 may select a time interval from a rising edge of the clock signal 13 to a subsequent rising edge as a selected clock cycle. The data identification module 210 may identify the data bits according to voltage values of the data signal waveform. Further details are described below.

Figure 5:
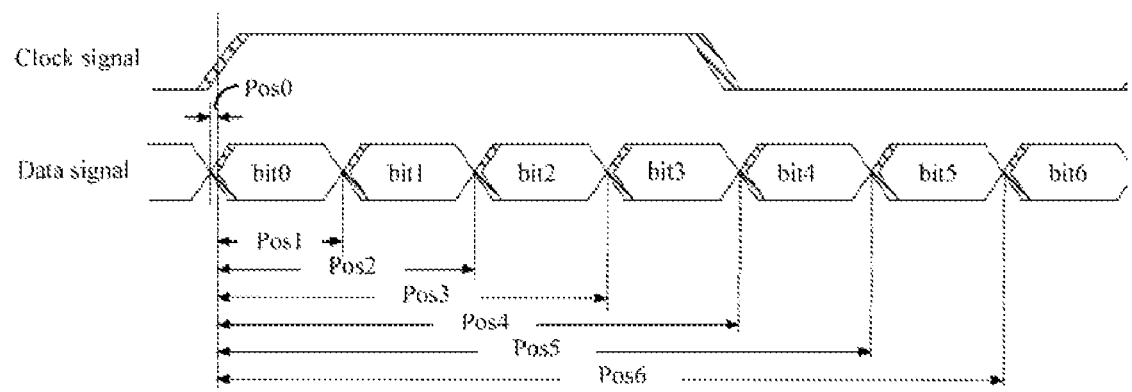
FIG. 5 illustrates one embodiment of bit positions in a 7-bit LVDS mode.

The timing analysis module 220 determines bit positions of the data bits relative to the clock signal 13. The bit positions denote the timing relationship between the clock signal 13 and the data signal 14. In one embodiment, the timing analysis module 220 may identify a start time of a data bit and a start time of the selected clock cycle. Accordingly, the timing analysis module 220 calculates a time difference between the start time of the data bit and the start time of the selected clock cycle as the bit position of the data bit. FIG. 5 illustrates one embodiment of bit positions in a 7-bit LVDS mode. In the 7-bit LVDS mode, seven data bits, such as data bits "bit0"-"bit6" are transmitted in a clock cycle. "Pos0"-"Pos6" are bit positions of the data bits "bit0"-"bit6."

The determination module 230 determines if the number of each of the bit positions is less than a predetermined number such as 10. The determination module 230 may further determine whether each of the bit positions complies with LVDS timing specifications. FIG. 6 illustrates one embodiment of the LVDS timing specifications. The determination module 230 may determine a minimum value and a maximum value of each of the bit positions. Accordingly, the determination module 230 determines whether the bit position complies with the LVDS timing specification.

The output module 240 outputs the bit position to the output device 15. The output module 240 may further output a result that indicates whether the bit positions comply with the LVDS timing specifications.

Figure 3:
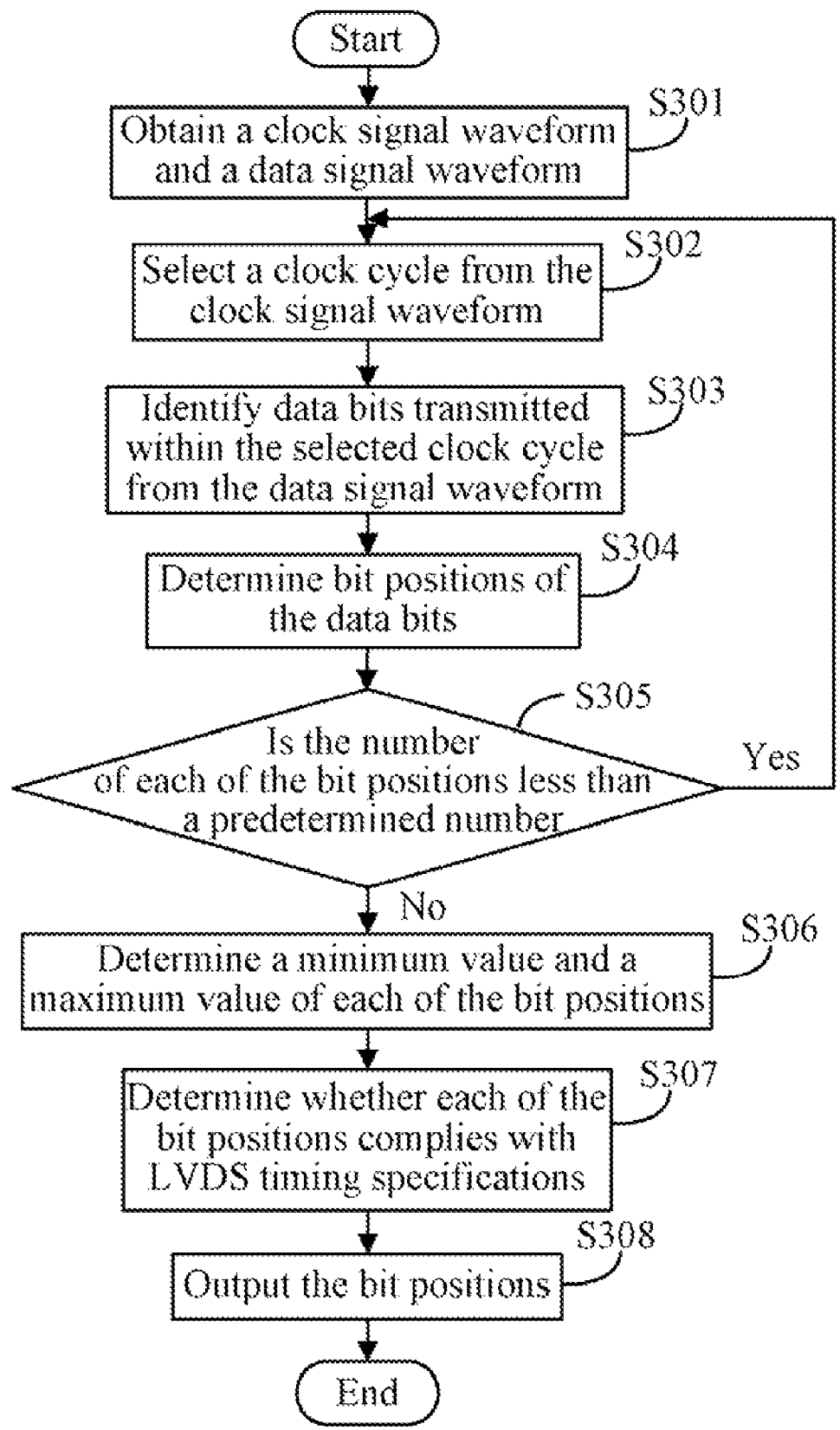
FIG. 3 is a flowchart of one embodiment of an LVDS timing test method implementing a test system, such as that in FIG. 1.

FIG. 3 is a flowchart of one embodiment of an LVDS timing test method implementing a test system, such as that in FIG. 1. The test method may be used to test a timing relationship between the clock signal 13 and the data signal 14 to determine whether data transmission of the LVDS device 12 is correct. Depending on the embodiments, additional blocks may be added, others removed, and the ordering of the blocks may be changed.

In block S301, the waveform obtaining module 200 obtains a clock signal waveform and a data signal waveform. As mentioned above, the clock signal waveform is a waveform of the clock signal 13, and the data signal waveform is a waveform of the data signal 14. In one embodiment, the waveform obtaining module 200 may control the oscilloscope 11 to obtain the clock signal waveform and the data signal waveform. The waveform obtaining module 200 may send a waveform capture command to the oscilloscope 11. In response to the waveform capture command, the oscilloscope 11 captures the clock signal waveform and the data signal waveform, and sends the clock signal waveform and the data signal waveform to the waveform obtaining module 200. FIG. 4 illustrates one embodiment of a clock signal waveform 40 and a data signal waveform 41, where voltage is represented by the y-axis and time is represented by the x-axis of the waveforms 40, 41.

In block S302, the data identification module 210 selects a clock cycle of the clock signal 13 from the clock signal waveform. In one embodiment, the data identification module 210 may select a time interval from a rising edge of the clock signal 13 to a subsequent rising edge as the selected clock cycle. In one embodiment with respect to FIG. 4, a clock cycle from "T0" to "T1" is selected.

In block S303, the data identification module 210 identifies data bits transmitted within the selected clock cycle from the data signal waveform. The data identification module 210 may identify the data bits according to voltage values of the data signal waveform. In one embodiment, a high voltage (e.g., 5V) may denote a bit of digital 1, a low voltage (e.g., 0V) may denote a bit of digital 0, and a bit width of the data bits may be about 5 ns. In one example with respect to FIG. 4, the LVDS device 12 transmits 7 data bits in each clock cycle such as the clock cycle 42. The data identification module 210 may identify data bits of "1100101" transmitted within the clock cycle 42, where a first data bit ("bit0") is 1, a second data bit ("bit1") is 1, a third data bit ("bit2") is 0, a fourth data bit ("bit3") is 0, a fifth data bit ("bit4") is 1, a sixth data bit ("bit5") is 0, and a seventh data bit ("bit6") is 1.

In block S304, the timing analysis module 220 determines bit positions of the data bits relative to the clock signal 13. The bit positions denote the timing relationship between the clock signal 13 and the data signal 14. In one embodiment, the timing analysis module 220 may identify a start time of a data bit and a start time of the selected clock cycle. Accordingly, the timing analysis module 220 calculates a time difference between the start time of the data bit and the start time of the selected clock cycle as the bit position of the data bit. FIG. 5 illustrates one embodiment of bit positions in a 7-bit LVDS mode. In the 7-bit LVDS mode, seven data bits, such as data bits denoted as "bit0"-"bit6" are transmitted in a clock cycle. "Pos0"-"Pos6" denote bit positions corresponding to the data bits of "bit0"-"bit6." In one embodiment, the timing analysis module 220 may determine bit positions corresponding to each high-to-low or low-to-high transition of the data signal 14. In one example with respect to FIG. 4, "t0," "t4," and "t6" denote low-to-high transitions, "t2" and "t5" denote high-to-low transitions. The timing analysis module 220 determines bit positions of "bit0," "bit2," "bit4," "bit5," and "bit6" respectively corresponding to "t0," "t2," "t4," "t5," and "t6."

In block S305, the determination module 230 determines whether the number of each of the bit positions is less than a predetermined number such as 10. In one example, ten values of each of the bit positions are desired. Accordingly, the determination module 230 determines whether the number of each of the bit positions is less than 10. If the number of the bit positions is less than the predetermined number, the procedure may return to block S302.

If the number of each of the bit positions is greater or equal to the predetermined number, in block S306, the determination module 230 determines a minimum value and a maximum value of each of the bit positions. In one example, ten "Pos1" values of 10.55, 10.64, 10.58, 10.73, 10.65, 10.52, 10.65, 10.75, 10.87 and 10.73 are obtained. Therefore, a minimum value of 10.52 ns and a maximum value of 10.87 ns are determined for "Pos1."

In block S307, the determination module 230 determines whether each of the bit positions complies with LVDS timing specifications according to the corresponding minimum value and maximum value. FIG. 6 illustrates one embodiment of the LVDS timing specifications. A minimum reference value of "Pos0" is (T/7−0.2) ns, a maximum reference value of "Pos0" is (T/7+0.2) ns, where "T" denotes a clock cycle. If the minimum value of "Pos0" is larger than the minimum reference value and the maximum value of "Pos0" is less than the maximum reference value, "Pos0" is determined in compliance with the LVDS timing specifications. The LVDS timing specification may change depending on the embodiment. For example, the LVDS timing specifications may define a relationship between the bit positions.

In block S308, the output module 240 outputs the bit positions to the output device 15. In one embodiment, the output module 240 outputs the minimum value and the maximum value of each of the bit positions to the output device 15. The output module 240 may further output a result that indicates whether the bit positions comply with the LVDS timing specifications.

Although certain disclosed embodiments of the present disclosure have been specifically described, the present disclosure is not to be construed as being limited thereto. Various changes or modifications may be made to the present disclosure without departing from the scope and spirit of the present disclosure.

What is claimed is:

1. A low voltage differential signaling (LVDS) timing test system, the test system comprising:
    a storage system;
    at least one processor;
    a timing test unit being stored in the storage system and executable by the at least one processor, the timing test unit comprising:
        a waveform obtaining module operable to obtain a waveform of a clock signal and a waveform of a data signal, wherein the clock signal and the data signal are generated by an LVDS device;
        a data identification module operable to select clock cycles of the clock signal from the waveform of the clock signal, and identify values of data bits transmitted within the selected clock cycles from the waveform of the data signal according to voltage values of the data signal waveform, wherein a data bit with a high voltage is identified as a digital 1, a data bit with a low voltage is identified as a digital 0;
        a timing analysis module operable to determine bit positions of the data bits relative to the clock signal;
        a determination module operable to determine whether the number of the bit positions of each of the data bits is less than a predetermined number, determine a minimum value and a maximum value of the bit positions of each of the data bits, and determine whether the bit positions of each of the data bits complies with LVDS timing specifications according to the minimum value and the maximum value of the bit positions of each of the data bits; and
        an output module operable to output the minimum value and the maximum value of the bit positions of each of the data bits to an output device.

2. The test system of claim 1, wherein the waveform obtaining module controls an oscilloscope connected to the LVDS device to obtain the waveform of the clock signal and the waveform of the data signal.

3. The test system of claim 1, wherein the timing analysis module determines the bit positions of the data bits by identifying a start time of each of the data bits.

4. The test system of claim 1, wherein the output device is a display screen or a printer.

5. A low voltage differential signaling (LVDS) timing test method being executed by a processor of a computerized device, the method comprising:
   obtaining a waveform of a clock signal and a waveform of a data signal, wherein the clock signal and the data signal are generated by an LVDS device;
   selecting a clock cycle of the clock signal from the waveform of the clock signal;
   identifying values of data bits transmitted within the selected clock cycle from the waveform of the data signal according to voltage values of the data signal waveform, wherein a data bit with a high voltage is identified as a digital 1, a data bit with a low voltage is identified as a digital 0;
   determining bit positions of the data bits relative to the clock signal;
   determining whether the number of the bit positions of each of the data bits is less than a predetermined number, determining a minimum value and a maximum value of the bit positions of each of the data bits, and determining whether the bit positions of each of the data bits complies with LVDS timing specifications according to the minimum value and the maximum value of the bit positions of each of the data bits; and
   outputting the minimum value and the maximum value of the bit positions of each of the data bits to an output device.

6. The method of claim 5, wherein the waveform of the clock signal and the waveform of the data signal are obtained by an oscilloscope that is connected to the LVDS device.

7. The method of claim 5, wherein the bit positions of the data bits are determined by identifying a start time of each of the data bits.

8. The method of claim 5, wherein the output device is a display screen or a printer.

9. A non-transitory computer-readable medium having stored thereon instructions that, when executed by a computerized device, cause the computerized device to execute a low voltage differential signaling (LVDS) timing test method, the method comprising:
   obtaining a waveform of a clock signal and a waveform of a data signal, wherein the clock signal and the data signal are generated by an LVDS device;
   selecting a clock cycle of the clock signal from the waveform of the clock signal;
   identifying values of data bits transmitted within the selected clock cycle from the waveform of the data signal according to voltage values of the data signal waveform, wherein a data bit with a high voltage is identified as a digital 1, a data bit with a low voltage is identified as a digital 0;
   determining bit positions of the data bits relative to the clock signal;
   determining whether the number of the bit positions of each of the data bits is less than a predetermined number, determining a minimum value and a maximum value of the bit positions of each of the data bits, and determining whether the bit positions of each of the data bits complies with LVDS timing specifications according to the minimum value and the maximum value of the bit positions of each of the data bits; and
   outputting the minimum value and the maximum value of the bit positions of each of the data bits to an output device.

10. The computer-readable medium of claim 9, wherein the waveform of the clock signal and the waveform of the data signal are obtained by an oscilloscope that is connected to the LVDS device.

11. The computer-readable medium of claim 9, wherein the bit positions of the data bits are determined by identifying a start time of each of the data bits.

12. The computer-readable medium of claim 9, wherein the output device is a display screen or a printer.

* * * * *